United States Patent
Zang et al.

(10) Patent No.: US 10,923,469 B2
(45) Date of Patent: Feb. 16, 2021

(54) VERTICAL RESISTOR ADJACENT INACTIVE GATE OVER TRENCH ISOLATION

(71) Applicant: GLOBALFOUNDRIES U.S. Inc., Santa Clara, CA (US)

(72) Inventors: Hui Zang, Guilderland, NY (US); Guowei Xu, Ballston Lake, NY (US); Jiehui Shu, Clifton Park, NY (US); Ruilong Xie, Niskayuna, NY (US); Yurong Wen, Singapore (SG); Garo J. Derderian, Saratoga Springs, NY (US); Shesh M. Pandey, Saratoga Springs, NY (US); Laertis Economikos, Wappingers Falls, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/244,169

(22) Filed: Jan. 10, 2019

(65) Prior Publication Data
US 2020/0227404 A1    Jul. 16, 2020

(51) Int. Cl.
| | |
|---|---|
| H01L 27/06 | (2006.01) |
| H01L 29/66 | (2006.01) |
| H01L 49/02 | (2006.01) |
| H01L 21/762 | (2006.01) |
| H01L 23/522 | (2006.01) |
| H01L 29/40 | (2006.01) |
| H01L 29/78 | (2006.01) |

(52) U.S. Cl.
CPC .... *H01L 27/0629* (2013.01); *H01L 21/76224* (2013.01); *H01L 23/5228* (2013.01); *H01L 28/20* (2013.01); *H01L 29/405* (2013.01); *H01L 29/66795* (2013.01); *H01L 29/7851* (2013.01)

(58) Field of Classification Search
CPC ............... H01L 27/0629; H01L 28/20; H01L 21/76224; H01L 23/5228; H01L 29/405; H01L 29/66795; H01L 29/7851; H01L 29/785; H01L 27/0886; H01L 27/0924; H01L 21/823481; H01L 21/823431; H01L 21/823821; H01L 29/6681
USPC ........................................................ 257/379
See application file for complete search history.

(56) References Cited

U.S. PATENT DOCUMENTS

| | | |
|---|---|---|
| 5,126,279 A | 6/1992 | Roberts |
| 7,977,754 B2 | 7/2011 | Chuang et al. |
| 8,304,839 B2 | 11/2012 | Thei et al. |
| 8,377,763 B2 | 2/2013 | Kanike |
| 8,482,099 B2 | 7/2013 | Enjalbert |
| 2010/0164001 A1 | 7/2010 | Park et al. |
| 2013/0105912 A1* | 5/2013 | Hsu ..................... H01L 27/0629 257/379 |

* cited by examiner

*Primary Examiner* — Selim U Ahmed
(74) *Attorney, Agent, or Firm* — Francois Pagette; Hoffman Warnick LLC

(57) ABSTRACT

An integrated circuit (IC) includes an active area including at least one active fin-type field effect transistor (FinFET), and a trench isolation adjacent to the active area. At least one inactive gate is positioned over the trench isolation. A vertically extending resistor body is positioned adjacent the at least one inactive gate over the trench isolation. A lower end of the resistor is below an upper surface of the trench isolation. The resistor reduces interconnect layer thickness to improve yield, and significantly reduces resistor footprint to enable scaling.

19 Claims, 7 Drawing Sheets

VERTICAL RESISTOR ADJACENT INACTIVE GATE OVER TRENCH ISOLATION

BACKGROUND

The present disclosure relates to integrated circuits, and more specifically, to a resistor with a vertically extending resistor body adjacent an inactive gate over a trench isolation, an integrated circuit (IC) including the resistor and a related method.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., interlayer dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type FETs ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. One or more FinFETs of a given polarity may be disposed within an area isolated by an isolation region, sometimes referred to as a trench isolation or shallow trench isolation (STI). Generally, a trench is etched into the substrate and filled with an insulating material such as oxide, to isolate one region of the substrate from an adjacent region of the substrate.

Resistors for an IC are oftentimes formed in ILD layers above the FinFETs. These layers are referred to as middle-of-line (MOL) layers and back-end-of-line (BEOL) layers. MOL layers are just above the front-end-of-line (FEOL) layers that include the FinFETs, and BEOL layers are above the MOL layers. Both MOL and BEOL layers provide scaling interconnects for the IC. Formation of the resistors in the MOL or BEOL layers requires a number of steps, e.g., masking, etching and depositing of materials, that adds to the complexity of the overall process and can reduce the yield window for these layers. The resistors also require an additional foundation layer that adds thickness to every MOL or BEOL layer in which a resistor is employed, thus increasing contact length. In addition, the resistors extend horizontally within the layers and can block access to other functional components therebelow, requiring complex electrical connections to those components or addition of more components not covered by the resistor.

SUMMARY

A first aspect of the disclosure is directed to a resistor for an integrated circuit, the resistor comprising: a vertically extending resistor body positioned adjacent at least one inactive gate over a trench isolation, wherein a lower end of the resistor is below an upper surface of the trench isolation.

A second aspect of the disclosure includes an integrated circuit (IC), comprising: an active area including at least one active fin-type field effect transistor (FinFET); a trench isolation adjacent to the active area; at least one inactive gate over the trench isolation; and a resistor including a vertically extending resistor body positioned adjacent the at least one inactive gate over the trench isolation, wherein a lower end of the vertically extending resistor body is below an upper surface of the trench isolation.

A third aspect of the disclosure related to a method, comprising: forming a plurality of dummy gates over an active area in a substrate and a trench isolation adjacent to the active area, each dummy gate separated from an adjacent dummy gate by a vertically extending dielectric; removing the vertically extending dielectric between a pair of the plurality of dummy gates over the trench isolation to create a resistor space, the resistor space extending into the trench isolation; forming a vertically extending resistor body in the resistor space to form a resistor; and forming a pair of spaced contacts to an upper end of the resistor body.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
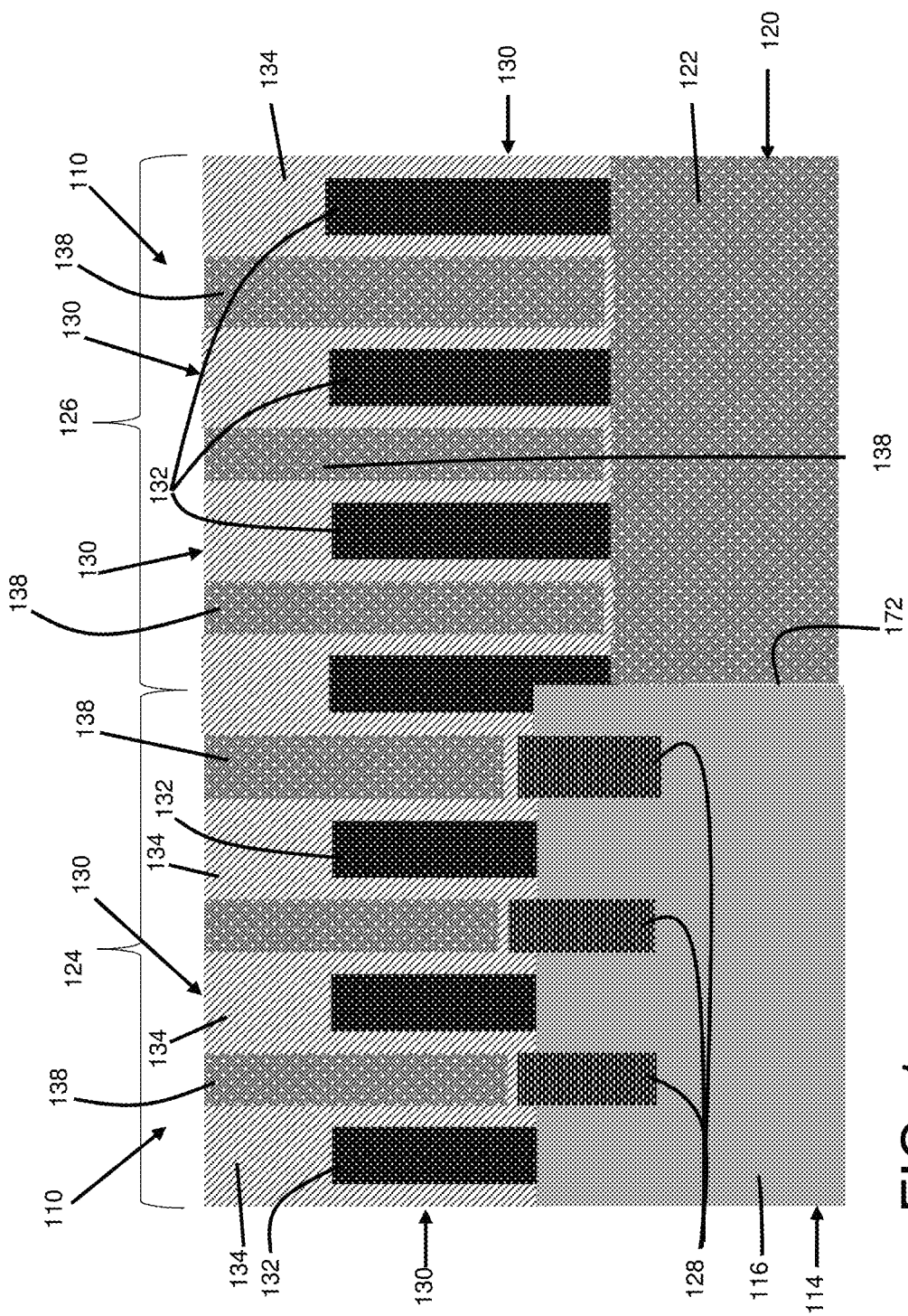
FIG. 1 shows a cross-sectional view of a preliminary structure for a method according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

A resistor for an integrated circuit (IC) and the IC including the resistor are disclosed herein. The resistor includes a vertically extending resistor body positioned adjacent at least one inactive gate over a trench isolation. A lower end of the resistor is below an upper surface of the trench isolation. The IC may include an active area adjacent to the trench isolation, and including at least one fin-type field effect transistor (FinFET). The vertically extending resistor positioning at the device layer and with inactive gates over a trench isolation removes the resistor from middle-of-line (MOL) or back-end-of-line (BEOL) interconnect layers. Consequently, the resistor reduces interconnect layer thickness and process complexity, improving yield. The resistor also significantly reduces resistor footprint by being arranged vertically compared to the conventional horizontal layout, i.e., it is taller than it is laterally wide. Thus, the resistor enables additional scaling. A method of making the resistor is also disclosed.

Referring to FIGS. 1-6, embodiments of a method of making a resistor 100 (FIG. 5) will now be described. A method may include forming a plurality of dummy gates 130 over an active area 124 and a trench isolation 122 adjacent to active area 124, each dummy gate 130 separated from an adjacent dummy gate 130 by a vertically extending dielectric 138. FIG. 1 shows a cross-sectional view of a preliminary structure 110 after formation of the afore-mentioned structure. Preliminary structure 110 includes an IC 112 in partially formed state and, in particular, after dummy gate formation in a replacement metal gate (RMG) process. Preliminary structure 110 includes a semiconductor substrate 114 including one or more semiconductor fins 116. While the side of one semiconductor fin 116 is shown, it is understood that a number of spaced fins extend into or out of the page of FIG. 1. Semiconductor substrate 114 and semiconductor fins 116 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Semiconductor fins 116 may be formed using any now known or later developed additive or subtractive process. For example, in one subtractive process, a mask may be patterned over a deposited or grown semiconductor substrate 114, and an etching may create fins 116. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as trenches.

Continuing with FIG. 1, an isolation region 120 is positioned in substrate 114 to separate devices of different polarity (not shown, built to right of isolation region 120) on substrate 114. Isolation region 120 may include any now known or later developed trench isolation 122. As understood in the art, trench isolation 122 may be formed by etching a trench 127 into substrate 114 and filling it with an insulating material to isolate one region of the substrate from an adjacent region of the substrate. One or more transistors of a given polarity may be disposed within an active area 124 isolated by trench isolation 122 from other active areas. Trench isolation 122 creates an inactive or passive area 126. Trench isolation 122 may also be referred to a shallow trench isolation (STI). Each trench isolation 122 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Preliminary structure 110 also has source/drain (S/D) regions 128 formed in semiconductor fin 116. As understood, S/D regions 128 will eventually be part of FinFETs 182 (FIG. 5) formed in active area 124. S/D regions 128 may be formed using any now known or later developed process, e.g., implantation of dopants into parts of semiconductor fin 116, perhaps with epitaxial growth to create raised S/D regions.

Preliminary structure 110 may also include a plurality of dummy gates 130 formed thereon. As understood in the art, dummy gates 130 are formed in positions that will eventually include metal gates for transistors in active area 124, and inactive gates in inactive area 126. That is, active area 124 includes at least one semiconductor fin 116 under plurality of dummy gates 130 therein. As understood in the art, as part of the RMG process, dummy gates 130 are employed to reserve the locations for metal gates for FinFETs 182 (FIG. 5) while allowing processing such as annealing to drive in dopants for S/D regions 128 that would harm the metal of the metal gates, if it were present. As part of the RMG process, the dummy gates are eventually replaced with metal gates. Dummy gates 130 may be formed using any now known or later developed process. In one non-limiting example, dummy gates 130 may be formed by depositing a sacrificial dummy gate material, and patterning a mask and etching to form the dummy gate bodies 132. The sacrificial dummy gate material may include any now known or later developed material for such purpose including but not limited to polysilicon or amorphous silicon. Dummy gates 130 may also include a cap 134 applied to each dummy gate body 132. Cap 134 may include any now known or later developed cap material such as but not limited to silicon nitride or a low dielectric constant (low-k) dielectric such as hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) [$(CH_3)_2SiO]_4$ 2.7 available from Air Liquide, or other low-k dielectrics. Cap 134 may extend over a top and sidewalls of dummy gate body 132.

Preliminary structure 110 may also include a vertically extending dielectric 138 positioned in the space between dummy gates 130. That is, vertically extending dielectric 138 extends between caps 134 of adjacent dummy gates 130, and is taller than it is wide. Vertically extending dielectric 138 may include an interlayer dielectric material capable of being etched out from the space between dummy gates 130. Suitable dielectric materials (also applicable for interlayer dielectrics (ILDs), described herein) include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning) may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In one example, silicon dioxide is used for vertically extending dielectric 138.

Figure 2:
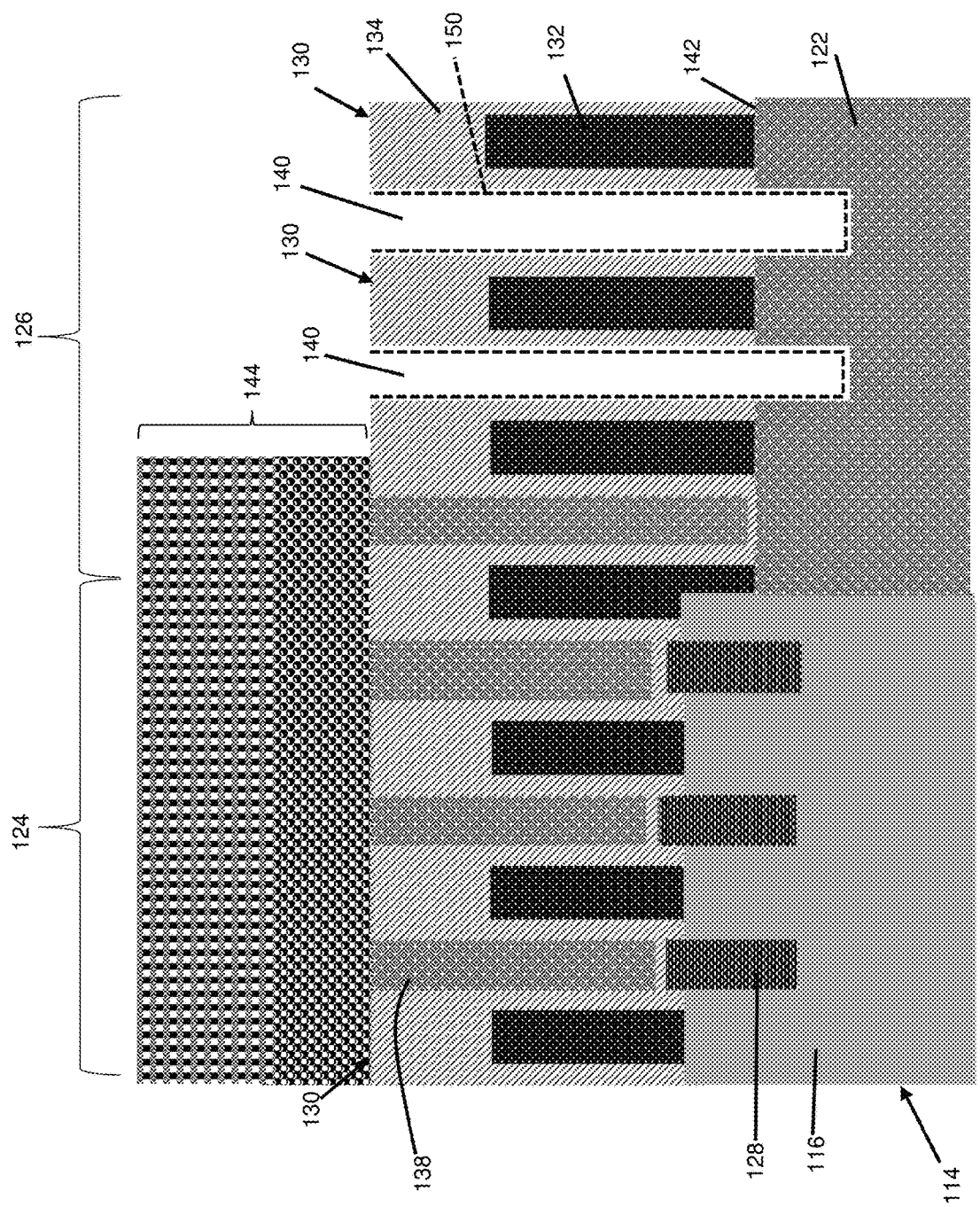
FIG. 2 shows a cross-sectional view of a process of forming a resistor space between inactive gates over a trench isolation, according to embodiments of the disclosure.
Figure 5:
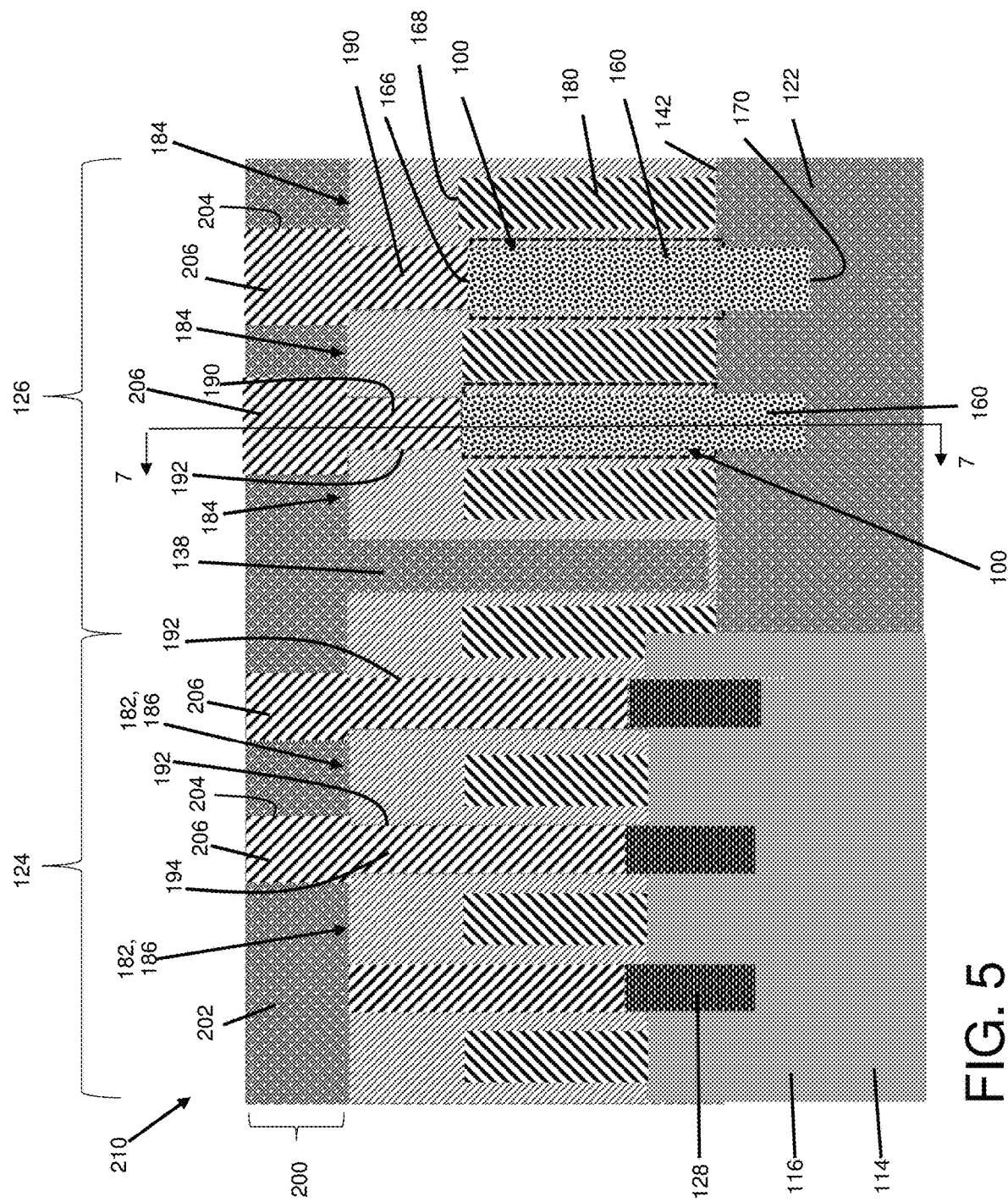
FIG. 5 shows a cross-sectional view of a resistor and an IC including the resistor after formation of contacts to the resistor, according to embodiments of the disclosure.

FIG. 2 shows a cross-sectional view of a process occurring after forming dummy gates 130 over active area 124 and trench isolation 122 adjacent to active area 124. FIG. 2 shows removing vertically extending dielectric 138 between a pair of dummy gates 130 over trench isolation 122. The removal of vertically extending dielectric 138 creates a resistor space 140 that is vertically extending, i.e., it is taller than it is wide. As will be described, each resistor space 140 will be used to form a resistor 100 (FIG. 5). Hence, the location of resistor space(s) 140 that are created can be user selected to create any number of resistors desired. The removal may occur using any now known or later developed process. In the example shown, a mask 144 is patterned over active area 124 to expose an area over the to-be resistor space 140 between select dummy gates 130 over inactive area 126. An etching, e.g., a RIE, is then performed to remove vertically extending dielectric 138, creating resistor space 140. Mask 144 may include any now known or later developed mask material(s). During the etching, caps 134 of dummy gates 130 are not removed because the cap material is harder than dielectric 138. Consequently, caps 134 act to self-align the etching to create resistor space 140. The etching continues to an extent to recess trench isolation 122, i.e., extend resistor space 140 beyond an upper surface 142 of the dielectric of trench isolation 122. As will be described, the extent (i.e., depth) to which resistor space 140 extends into trench isolation 122 can be controlled to customize the resistivity capabilities of the resulting resistor 100 (FIG. 5). In the example shown, two resistor spaces 140 are created that will result in two resistors being formed. It is appreciated that any number of resistor spaces 140 desired can be created using this process, including just one.

FIG. 2 also shows an optional step of forming a buffer layer 150 within resistor space 140, e.g., along sidewalls of cap 134 of dummy gates 130. Buffer layer 150 may be formed by depositing a dielectric and then etching to recess it back. Buffer layer 150 may include any dielectric capable of protecting dummy gate 130 such as but not limited to hafnium oxide, aluminum oxide, titanium nitride, titanium oxide and/or aluminum nitride. Buffer layer 150 is not shown in all of the subsequent figures for clarity.

Figure 3:
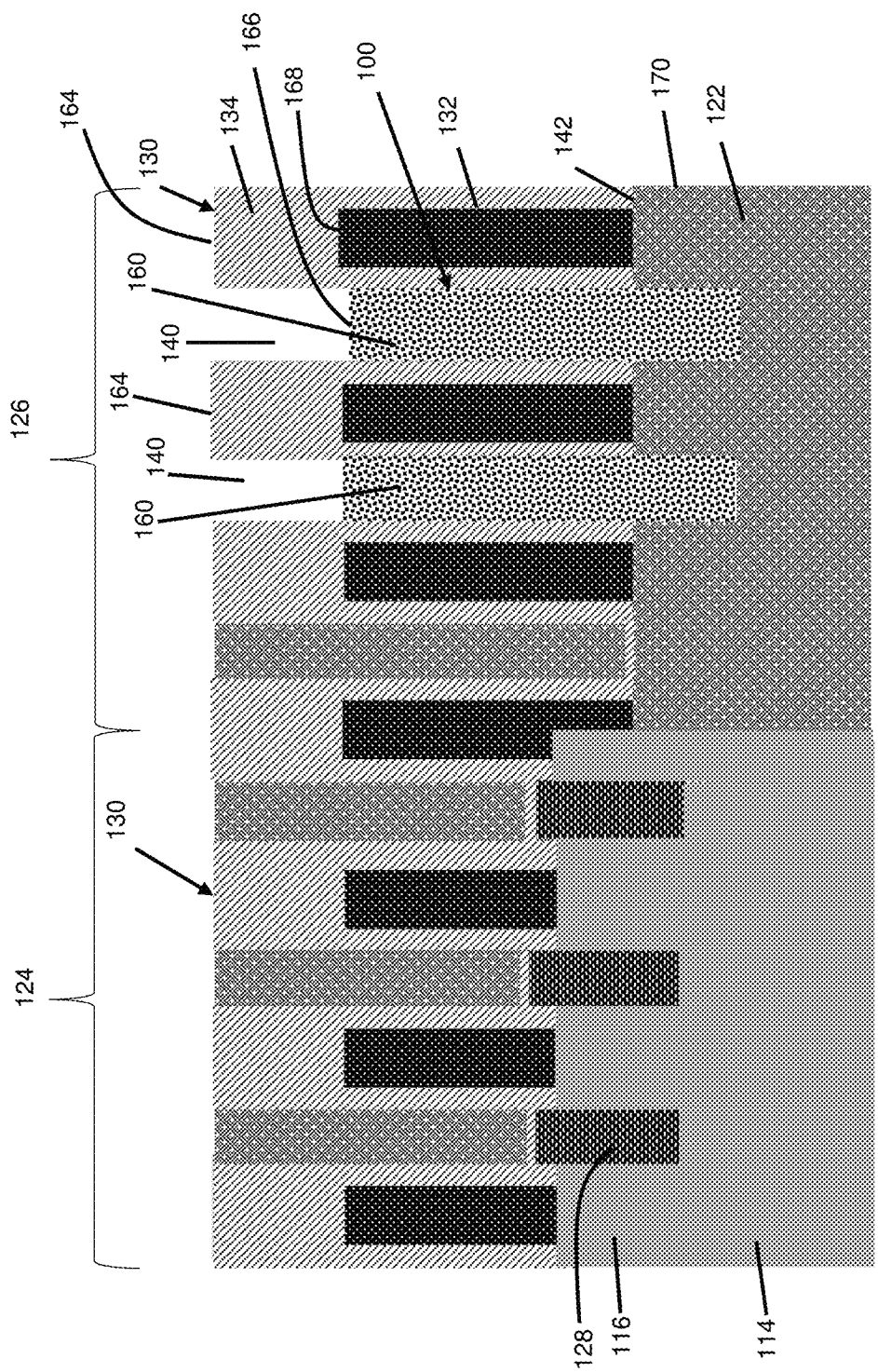
FIG. 3 shows a cross-sectional view of a process of forming a resistor including a vertically extending resistor body adjacent inactive gate(s) over a trench isolation, according to embodiments of the disclosure.

FIG. 3 shows a cross-sectional view of forming a vertically extending resistor body 160 in each resistor space 140 to form a resistor(s) 100. That is, a resistor material is deposited in resistor space 140, e.g., using ALD, the resistor material is recessed below an upper surface 164 of caps 134 to form vertically extending resistor body 160. Vertically extending resistor body 160 is taller than it is laterally wide. In one example, vertically extending resistor body 160 may have an aspect ratio (height to width) in the range of 10:1 to 2:1. Resistor body 160 may include any now known or later resistor material such as but not limited to: polysilicon, doped polysilicon, doped silicon, and tungsten silicide. Where provided, buffer layer 150 would lie between resistor body 160 and each cap 134, e.g., a sidewall portion of each cap of dummy gates 130. Resistor body 160 may be formed by depositing resistor body material, e.g., tungsten silicide, planarizing (not shown), and recessing/etching it back below upper surface 164 of caps 134. As understood in the art, planarization refers to various processes that make a surface more planar (that is, more flat and/or smooth). Chemical-mechanical-polishing (CMP) is one currently conventional planarization process which planarizes surfaces with a combination of chemical reactions and mechanical forces. The etching may include a RIE. During the etching, caps 134 again act to self-align the etch into resistor space 140. Although not necessary, in one embodiment, an upper end 166 of resistor body 160 may end up being coplanar with an upper end 168 of gate body 132 of at least one dummy gate 130. In any event, a lower end 170 of resistor body 160 is below upper surface 142 of trench isolation 122. In other words, lower end 170 of resistor body 160 is embedded within trench isolation 122, i.e., within the trench isolation material. The extent (i.e., depth) to which lower end 170 extends into trench isolation 122 can be controlled to customize the resistivity capabilities of resistor 100 (FIG. 5) by controlling its volume and/or vertical size.

Figure 4:
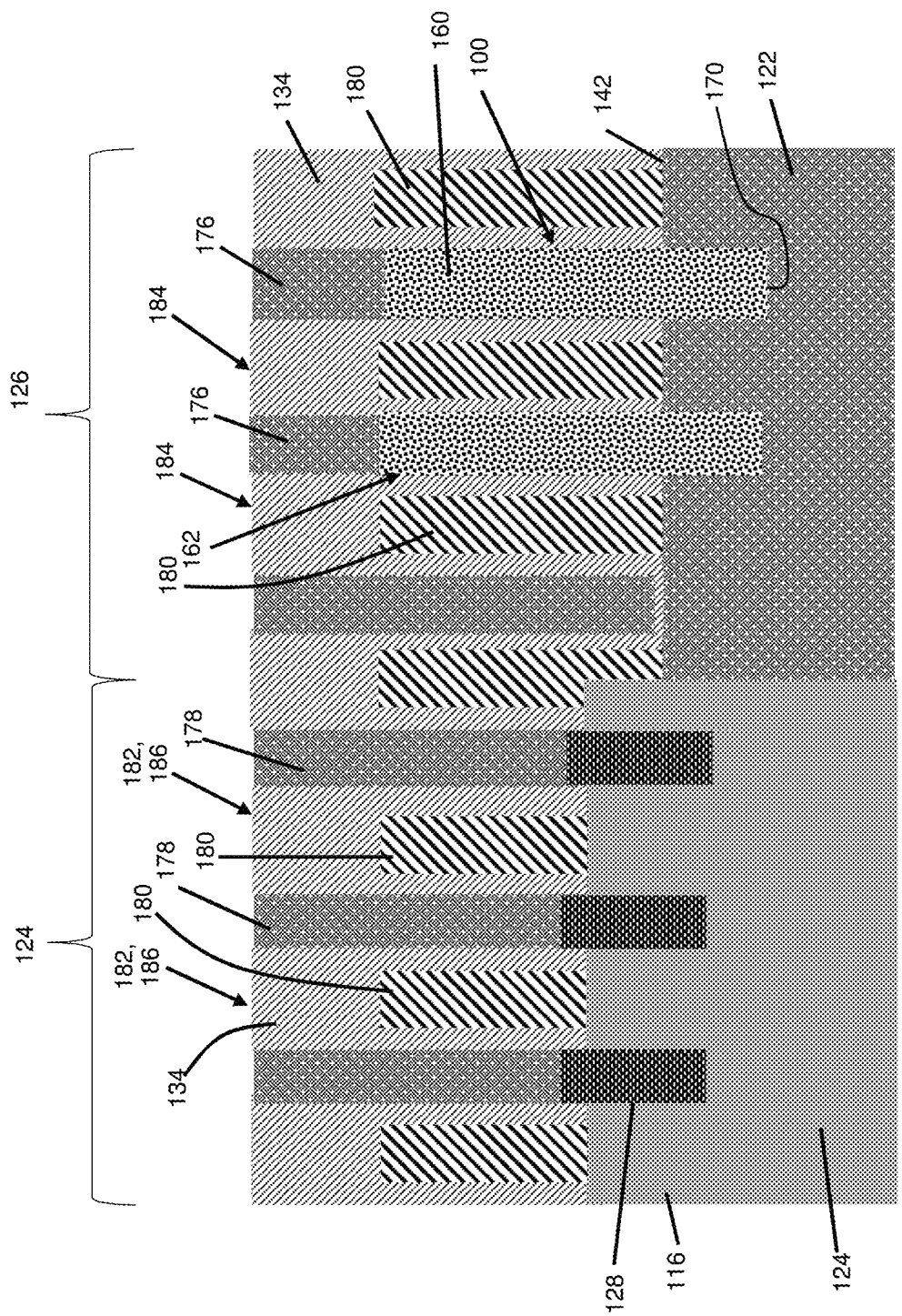
FIG. 4 shows a cross-sectional view of initial steps for forming contacts to the resistor and a replacement metal gate (RMG) step, according to embodiments of the disclosure.

FIG. 4 shows a cross-sectional view after a number of additional steps of a method according to embodiments of the disclosure. First, FIG. 4 shows an initial step of forming a pair of spaced contacts to resistor body 160, creating contacts for resistor 100 (FIG. 5). In particular, FIG. 4 shows depositing a dielectric 176, i.e., an ILD cap, over resistor body 160, filling a remainder of resistor space 140. As will be described, contacts for resistor 100 (FIG. 1) will be positioned in ILD cap 176. ILD cap 176 may include any of the ILD materials listed elsewhere herein. FIG. 4 also shows the structure after replacing plurality of dummy gates 130 with a metal gate material 180. As part of the RMG process, caps 134 are opened and dummy gate body 132 removed, e.g., using a patterned mask and etching. A metal gate material 180 is then deposited, etched back and caps 134 reformed. Metal gate material 180 may include any now known or later developed metal gate layer(s) such as but not limited to: aluminum (Al), zinc (Zn), indium (In), copper (Cu), indium copper (InCu), tin (Sn), tantalum (Ta), tantalum nitride (TaN), tantalum carbide (TaC) titanium (Ti), titanium nitride (TiN), titanium carbide (TiC), tungsten (W), tungsten nitride (WN), tungsten carbide (WC), and/or polysilicon (poly-Si) or combinations thereof. Any desired gate dielectric layer and/or work function metal (neither shown) may also be employed. Formation of metal gate material 180 forms at least one FinFET 182 (with active gate 186) in active area 124 and at least one inactive gate 184 over trench isolation 122. As understood in the art, FinFET(s) 182 result from metal active gate 186 forming a channel region in semiconductor fins 116. In contrast, inactive gates 184 result over trench isolation 122 in inactive area 126 because no semiconductor fins are present in that area. Inactive gates 184 will not be part of an active transistor, nor will they carry conducting current.

Figure 6:
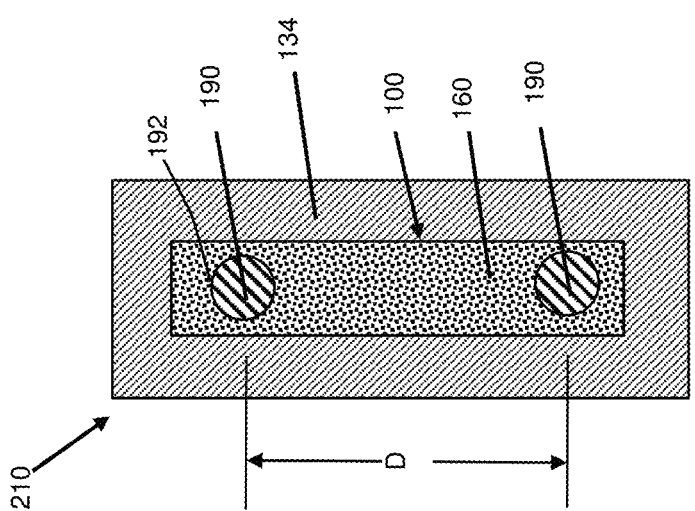
FIG. 6 shows a top down view of a portion of the IC including contacts to a resistor, according to embodiments of the disclosure.
Figure 7:
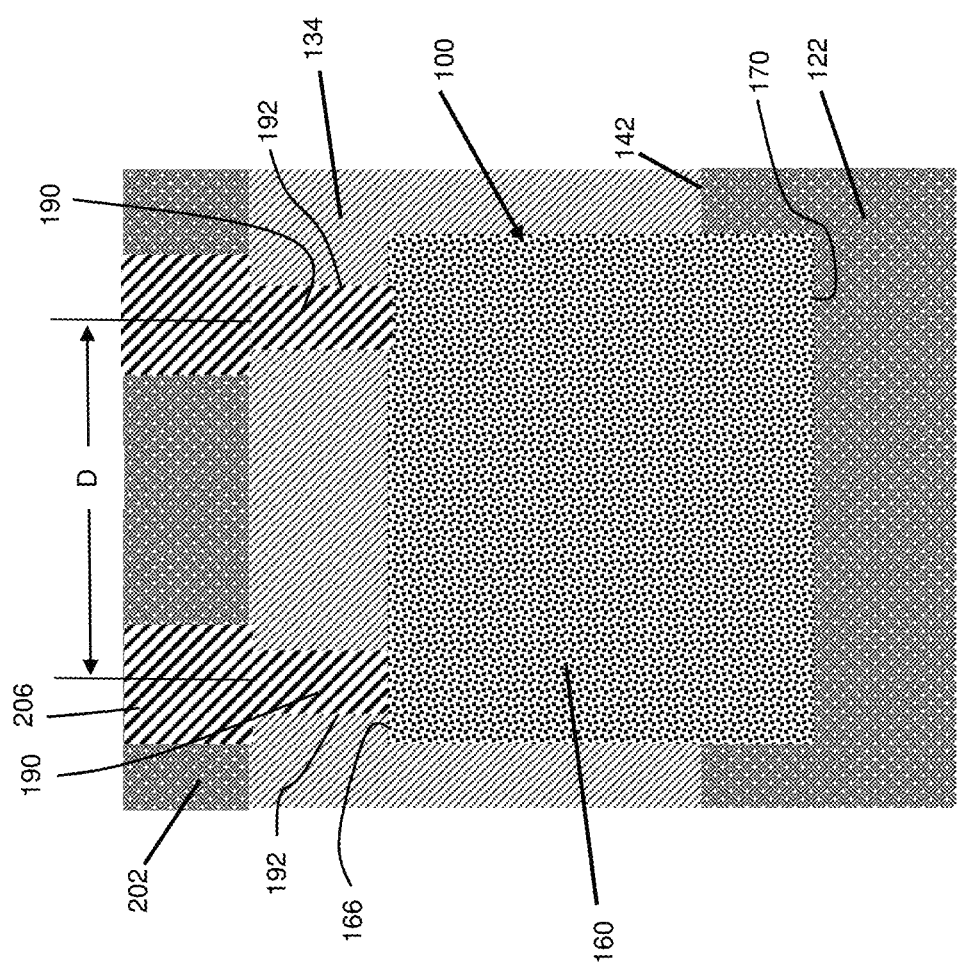
FIG. 7 shows a cross-sectional view of the resistor after formation of contacts to the resistor along line 7-7 in FIG. 5, according to embodiments of the disclosure.

FIGS. 5 and 6 show a cross-sectional view and a top down view, respectively, of the completion of forming pair of spaced contacts 190 to upper end 166 of resistor body 160. In FIG. 5, contact openings 192 are formed for pair of spaced contacts 190 to resistor body 160 and for source/drain regions 128 of at least one FinFET 182. Contact openings 192 may be formed using any now known or later developed process for S/D contact (trench silicide) formation. In one embodiment, an etch is performed to remove dielectric 176 (FIG. 4), i.e., ILD cap, over resistor body 160, and dielectric 178 (FIG. 4) over S/D regions 128. The etch may be self-aligned by caps 134 of active gates 186 and inactive gates 184. A conductor may then be deposited in contact openings 192 to create contacts 190 to resistor 100 and contacts 194 to S/D regions 128. Any necessary planarization can thereafter be performed to remove excess conductor. The conductor may include any appropriate conductive material, e.g., copper, for contacts in an IC, and any necessary liner materials (not shown) may be employed. FIG. 6 shows a top down view with dielectric 176 (FIG. 4) and interconnect layer 200 (FIG. 5) not shown, and FIG. 7 shows a cross-sectional view of resistor 100 along line 7-7 in FIG. 5. As shown in FIGS. 6 and 7, a distance D between pair of contacts 190 to resistor 100 may be customized to determine, e.g., set, a resistivity of resistor 100. That is, contact openings 192 can be formed with distance D set to a desired amount to create a resistor 100 with the desired resistivity, e.g., increasing distance D increases a length of resistor 100 and hence increases its resistivity. While two contacts 190 are shown, it is understood that more than a pair may be used.

FIG. 5 also shows forming a first interconnect layer 200, e.g., a first MOL layer. Interconnect layer 200 may be formed using any now known or later developed process. For example, an ILD 202 may be deposited, and then patterned and etched (using a mask, not shown) to create contact openings 204. A conductor may then be deposited, perhaps after a liner material, and planarized to form contacts 206. Since interconnect layer 200 does not include resistor 100, it may be made thinner than conventional interconnect layers at the same level of the IC, thus improving yield for those levels.

FIG. 5 also shows embodiments of resistor 100 for an IC, and an IC 210, according to embodiments of the disclosure. IC 210 includes active area 124 including at least one FinFET 182, and trench isolation 122 adjacent to active area 124. Trench isolation 122 defines inactive area 126. Active area 124 includes FinFET(s) 182, and inactive area 126 includes at least one inactive gate 184. Thus, trench isolation 122 and inactive gate(s) 184 therein are adjacent an active area 124 of IC 210 including FinFET(s) 182.

IC 210 also includes resistor 100 that includes vertically extending resistor body 160 positioned adjacent inactive gate(s) 184 over trench isolation 122. Resistor 100 on the left is adjacent to only one inactive gate 184, and resistor 100 on the right is adjacent two inactive gates 184, i.e., it is between them. A lower end 170 of resistor body 160 is below upper surface 142 of trench isolation 122. That is, lower end 170 of resistor body 160 is embedded within trench isolation 122. A pair of contacts 190 are electrically connected to upper end 166 of resistor body 160. Contacts 206 in interconnect layer 200 connect resistor 100 to other structures. As described herein relative to FIG. 6, a distance D between pair of contacts 190 determines a resistivity of resistor 100. While not necessary, upper end 166 of resistor body 160 may be coplanar with upper end 168 of gate body 132 of inactive gate 130. Each inactive gate 184 includes gate body 132 having cap 134 thereover. As shown in FIGS. 2 and 5 in phantom, buffer layer 150 may be positioned between resistor body 160 and each cap 134.

Resistor 100 according to embodiments of the disclosure reduces interconnect layer 200 (FIG. 5) thickness to improve the yield of middle-of-line (MOL) or back-end-of-line (BEOL) interconnect layers. Resistor 100 also significantly reduces resistor footprint, i.e., by being turned vertically (more tall than laterally wide) compared to the conventional horizontal layout, which enables scaling.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A resistor for an integrated circuit, the resistor comprising:
a vertically extending resistor body positioned adjacent at least one inactive gate over a trench isolation, wherein a lower end of the resistor body is below an upper surface of the trench isolation, and, wherein the trench isolation and the at least one inactive gate are adjacent an active area of the IC, the active area including at least one active fin-type field effect transistor (FinFET).

2. The resistor of claim 1, wherein the lower end of the resistor body is embedded within the trench isolation.

3. The resistor of claim 1, further comprising a pair of contacts electrically connected to an upper end of the resistor, a distance between the pair of contacts determining a resistivity of the resistor.

4. The resistor of claim 1, wherein an upper end of the resistor is coplanar with an upper end of a gate body of the at least one inactive gate.

5. The resistor of claim 1, wherein the resistor body includes a material selected from the group consisting of: polysilicon, doped polysilicon, doped silicon, and tungsten silicide.

6. The resistor of claim 1, wherein the at least one inactive gate includes a gate body having a cap thereover, and the resistor further comprises a buffer layer between the resistor body and each cap.

7. An integrated circuit (IC), comprising:
an active area including at least one active fin-type field effect transistor (FinFET);
a trench isolation adjacent to the active area;
at least one inactive gate over the trench isolation; and
a resistor including a vertically extending resistor body positioned adjacent the at least one inactive gate over the trench isolation,
wherein a lower end of the vertically extending resistor body is below an upper surface of the trench isolation.

8. The IC of claim 7, wherein the lower end of the vertically extending resistor body is embedded within the trench isolation.

9. The IC of claim 7, further comprising a pair of contacts electrically connected to an upper end of the vertically extending resistor body, a distance between the pair of contacts determining a resistivity of the resistor.

10. The IC of claim 7, wherein an upper end of the vertically extending resistor body is coplanar with an upper end of a gate body of the at least one inactive gate.

11. The IC of claim 7, wherein the at least one inactive gate includes a gate body having a cap thereover, and the IC further comprises a buffer layer between the vertically extending resistor body and each cap.

12. A method, comprising:
forming a plurality of dummy gates over an active area in a substrate and a trench isolation adjacent to the active area, each dummy gate separated from an adjacent dummy gate by a vertically extending dielectric, wherein the active area includes at least one semiconductor fin under the plurality of dummy gates therein;
forming at least one active fin-type field effect transistor (FinFET) in the active area;
forming at least one inactive gate over the trench isolation;
removing the vertically extending dielectric between a pair of the plurality of dummy gates over the trench isolation to create a resistor space, the resistor space extending into the trench isolation;
forming a vertically extending resistor body in the resistor space to form a resistor; and
forming a pair of spaced contacts to an upper end of the resistor body.

13. The method of claim 12, wherein each dummy gate includes a dummy gate body having a cap thereover, wherein the vertically extending dielectric extends between caps of adjacent dummy gates.

14. The method of claim 13, wherein the forming the vertically extending resistor body includes:
depositing a resistor material in the resistor space; and
recessing the resistor material below an upper surface of the caps to form the vertically extending resistor body.

15. The method of claim 14, wherein an upper end of the resistor body is coplanar with an upper end of a gate body of at least one dummy gate.

16. The method of claim 12, wherein removing the vertically extending dielectric between the a pair of the plurality of dummy gates over the trench isolation includes patterning a mask to expose the resistor space, etching to remove the vertically extending dielectric and etching to recess the trench isolation.

17. The method of claim 12, wherein a lower end of the resistor body is below an upper surface of the trench isolation and embedded within the trench isolation.

18. The method of claim 12, further comprising replacing the plurality of dummy gates with a metal gate material.

19. The method of claim 18, wherein forming the pair of spaced contacts to the upper end of the resistor body includes:

depositing a dielectric over the resistor body;
forming contact openings for the pair of spaced contacts to the resistor body and for source/drain regions of the at least one FinFET; and
depositing a conductor in the contact openings.

* * * * *